United States Patent
Huang et al.

(10) Patent No.: US 10,134,897 B2
(45) Date of Patent: Nov. 20, 2018

(54) SEMICONDUCTOR DEVICE AND FABRICATION METHOD THEREOF

(71) Applicant: Taiwan Semiconductor Manufacturing Company, Ltd., Hsin-Chu (TW)

(72) Inventors: Yu-Lien Huang, Jhubei (TW); Zhao-Cheng Chen, New Taipei (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 14/918,134

(22) Filed: Oct. 20, 2015

(65) Prior Publication Data
US 2016/0043224 A1    Feb. 11, 2016

Related U.S. Application Data (62) Division of application No. 13/666,559, filed on Nov. 1, 2012, now Pat. No. 9,171,762.

(51) Int. Cl.
| | | |
|---|---|---|
| *H01L 29/78* | (2006.01) | |
| *H01L 21/8234* | (2006.01) | |
| *H01L 29/66* | (2006.01) | |
| *H01L 29/04* | (2006.01) | |
| *H01L 29/165* | (2006.01) | |
| *H01L 27/12* | (2006.01) | |
| *H01L 29/06* | (2006.01) | |
| *H01L 29/08* | (2006.01) | |
| *H01L 29/161* | (2006.01) | |
| *H01L 29/423* | (2006.01) | |

(Continued)

(52) U.S. Cl.
CPC .. *H01L 29/7848* (2013.01); *H01L 21/823412* (2013.01); *H01L 21/823425* (2013.01); *H01L 27/1207* (2013.01); *H01L 29/045* (2013.01); *H01L 29/0653* (2013.01); *H01L 29/0847* (2013.01); *H01L 29/161* (2013.01); *H01L 29/165* (2013.01); *H01L 29/42364* (2013.01); *H01L 29/66636* (2013.01); *H01L 21/0262* (2013.01); *H01L 21/02532* (2013.01); *H01L 21/02579* (2013.01); *H01L 29/4966* (2013.01)

(58) Field of Classification Search
CPC .......... H01L 29/66636; H01L 29/7848; H01L 29/66659; H01L 29/7835; H01L 29/78624
See application file for complete search history.

(56) References Cited

U.S. PATENT DOCUMENTS

| | | |
|---|---|---|
| 6,403,482 B1 | 6/2002 | Rovedo et al. |
| 6,677,637 B2 | 1/2004 | Bernstein et al. |
| 7,750,338 B2 | 7/2010 | Wang |

(Continued)

*Primary Examiner* — Bryan Junge
(74) *Attorney, Agent, or Firm* — Haynes and Boone, LLP (57) ABSTRACT

A semiconductor device and a method for fabricating the semiconductor device are disclosed. A gate stack is formed over a surface of the substrate. A recess cavity is formed in the substrate adjacent to the gate stack. A first epitaxial (epi) material is then formed in the recess cavity. A second epi material is formed over the first epi material. A portion of the second epi material is removed by a removing process. The disclosed method provides an improved method by providing a second epi material and the removing process for forming the strained feature, therefor, to enhance carrier mobility and upgrade the device performance.

20 Claims, 7 Drawing Sheets

(51) Int. Cl.
*H01L 21/02* (2006.01)
*H01L 29/49* (2006.01)

(56) References Cited

U.S. PATENT DOCUMENTS

| | | | |
|---|---|---|---|
| 7,786,518 | B2 | 8/2010 | Chakravarthi et al. |
| 7,943,969 | B2 | 5/2011 | Yang et al. |
| 8,114,747 | B2 | 2/2012 | Paone et al. |
| 8,426,916 | B2 | 8/2013 | Kim et al. |
| 2008/0142886 | A1* | 6/2008 | Liao ............... H01L 21/02057 257/347 |
| 2009/0258463 | A1* | 10/2009 | Kim ................ H01L 29/7848 438/142 |
| 2011/0049637 | A1* | 3/2011 | Wiatr ............. H01L 21/28123 257/368 |
| 2011/0256681 | A1* | 10/2011 | Lin .................. H01L 29/665 438/285 |
| 2011/0287611 | A1 | 11/2011 | Cheng et al. |
| 2012/0056245 | A1 | 3/2012 | Kang et al. |
| 2012/0168821 | A1* | 7/2012 | Cheng ............ H01L 21/823412 257/192 |
| 2012/0248436 | A1 | 10/2012 | Dube et al. |
| 2012/0329252 | A1* | 12/2012 | Yoo ................ H01L 29/66636 438/478 |
| 2013/0069081 | A1* | 3/2013 | Blatchford ......... H01L 27/088 257/77 |
| 2013/0240956 | A1 | 9/2013 | Hou et al. |
| 2014/0117456 | A1 | 5/2014 | Huang et al. |

\* cited by examiner

Fig. 7

SEMICONDUCTOR DEVICE AND FABRICATION METHOD THEREOF

PRIORITY DATA

The present application is a divisional application of U.S. application Ser. No. 13/666,559, filed Nov. 1, 2012, which is incorporated herein by reference in its entirety.

FIELD

The disclosure relates to integrated circuit fabrication and, more particularly, to a semiconductor device with a strained structure.

BACKGROUND

When a semiconductor device, such as a metal-oxide-semiconductor field-effect transistor (MOSFET), is scaled down through various technology nodes, high-k gate dielectric layers and metal gate electrode layers are incorporated into the gate stack of the MOSFET to improve device performance with the decreased feature sizes. In addition, strained structures in source and drain (S/D) recess cavities of the MOSFET utilizing selectively grown silicon germanium (SiGe) may be used to enhance carrier mobility.

However, there are challenges to implement such features and processes in complementary metal-oxide-semiconductor (CMOS) fabrication. As the gate length and spacing between devices decrease, these problems are exacerbated. For example, it is difficult to achieve enhanced carrier mobility for a semiconductor device, because strained materials cannot deliver a given amount of strain into the channel region of the semiconductor device, thereby increasing the likelihood of device instability and/or device failure.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the relative dimensions of the various features may be arbitrarily increased or reduced for clarity of discussion.

DESCRIPTION

It is understood that the following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1:
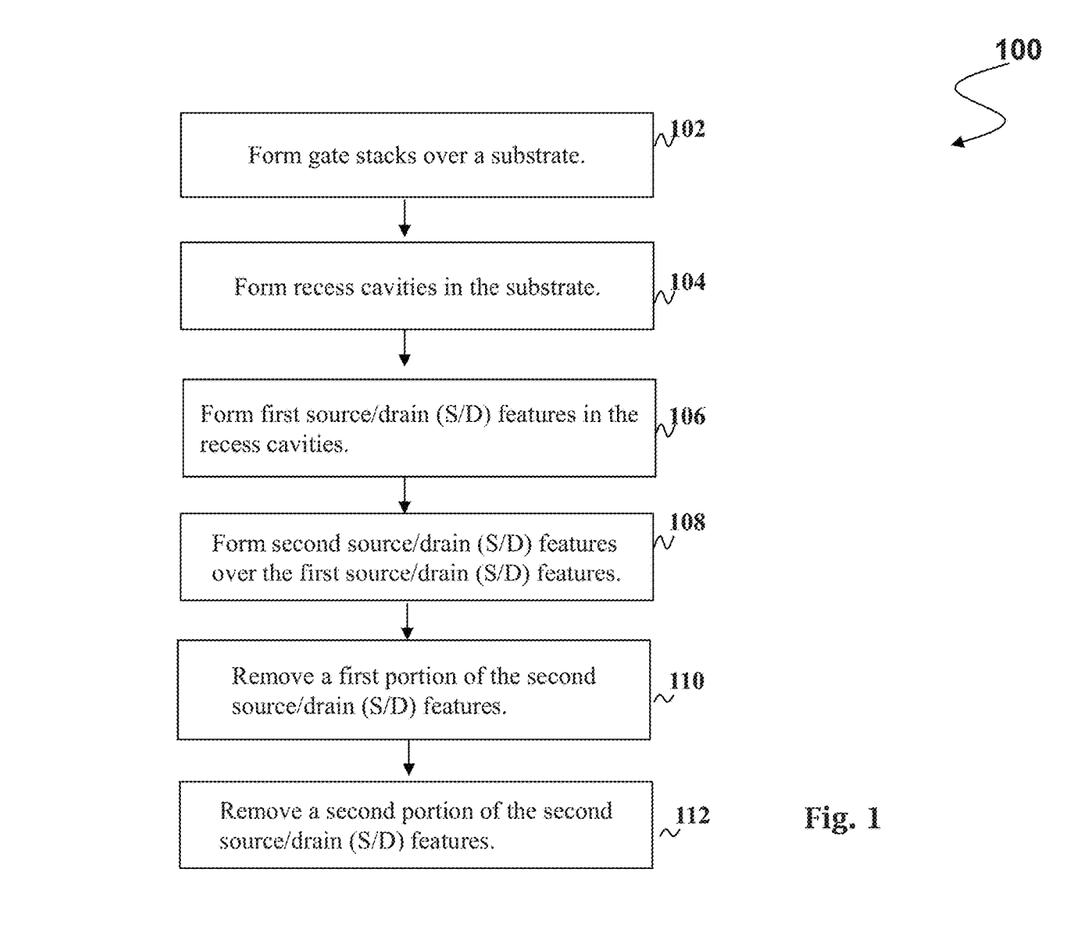
FIG. 1 is a flowchart illustrating a method for fabricating a semiconductor device comprising a strained structure according to various aspects of the present disclosure.

FIG. 1 is a flowchart illustrating a method 100 for fabricating a semiconductor device 200 according to various aspects of the present disclosure. FIGS. 2-7 show schematic cross-sectional views of a semiconductor device 200 at various stages of fabrication according to an embodiment of the method 100 of FIG. 1. The semiconductor device 200 may be included in a microprocessor, memory cell, and/or other integrated circuit (IC). It is noted that the method of FIG. 1 does not produce a completed semiconductor device 200. A completed semiconductor device 200 may be fabricated using complementary metal-oxide-semiconductor (CMOS) technology processing. Accordingly, it is understood that additional processes may be provided before, during, and after the method 100 of FIG. 1, and that some other processes may only be briefly described herein. Also, FIGS. 1 through 7 are simplified for a better understanding of the present disclosure. For example, although the figures illustrate the semiconductor device 200, it is understood the IC may comprise a number of other devices comprising resistors, capacitors, inductors, fuses, etc.

Figure 2:
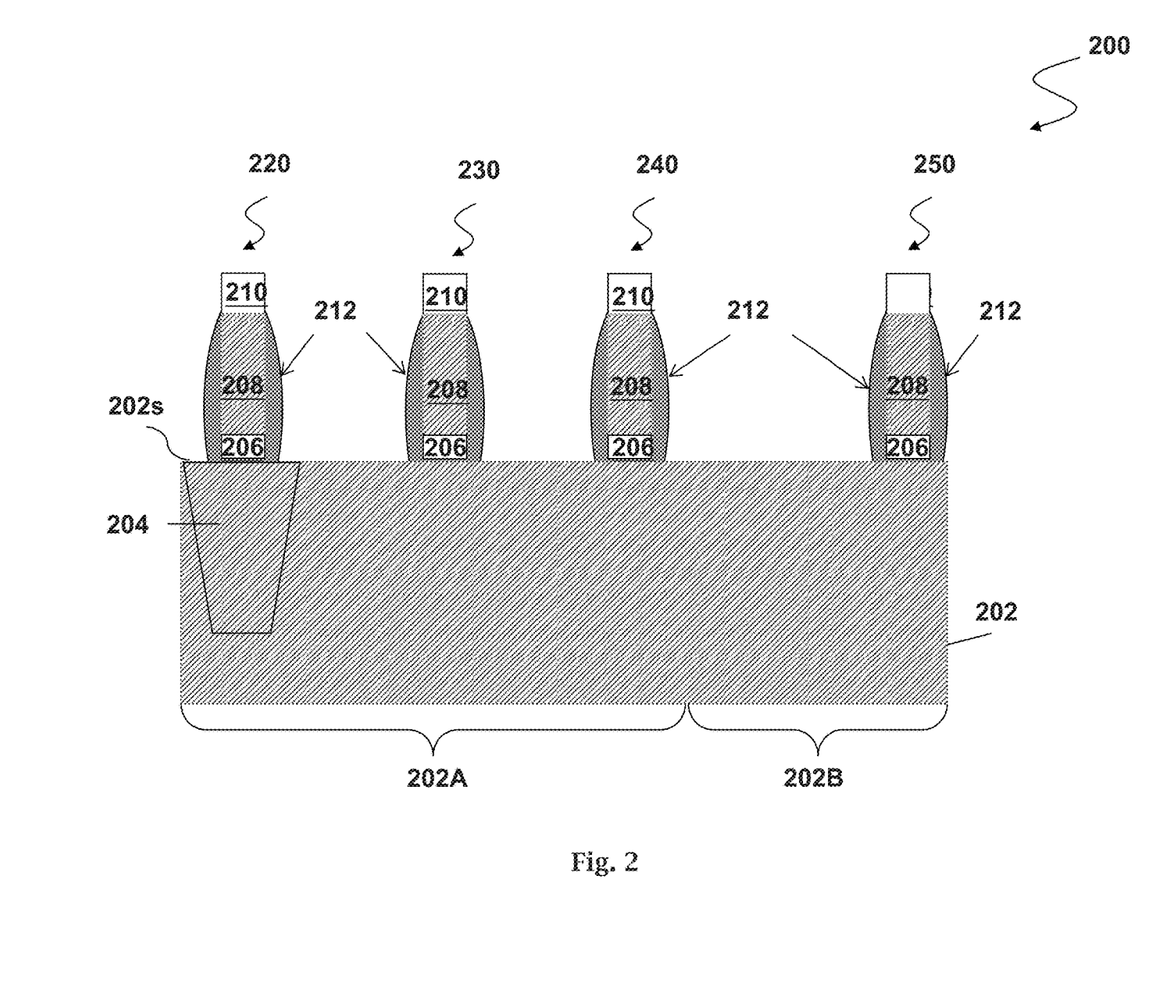
FIGS. 2-7 show schematic cross-sectional views of a strained structure of a semiconductor device at various stages of fabrication according to various aspects of the present disclosure.

Referring to FIGS. 1 and 2, the method 100 begins at step 102 wherein gate stacks 220, 230, 240, and 250 are formed over a substrate 202. The substrate 202 includes a top surface 202s. In one embodiment, the substrate 202 comprises a crystalline silicon substrate (e.g., Si wafer). In the present embodiment, the substrate 202 is referred to as a (100) substrate having the top surface 202s formed of the (100) crystal plane. In an alternative embodiment, the substrate 202 may include a silicon-on-insulator (SOI) structure.

In some embodiments, the substrate 202 further comprises active regions. The active regions may include various doping configurations depending on design requirements. In some embodiments, the active regions may be doped with p-type or n-type dopants. For example, the active regions may be doped with p-type dopants, using a chemical such as boron or $BF_2$ to perform the doping; n-type dopants, using a chemical such as phosphorus or arsenic to perform the doping; and/or combinations thereof. The active regions may act as regions configured for an N-type metal-oxide-semiconductor transistor device (referred to as an NMOS transistor device) and regions configured for a P-type metal-oxide-semiconductor transistor device (referred to as a PMOS transistor device).

In some embodiments, an isolation structure 204 is formed in the substrate 202 to isolate the various active regions. In some embodiments, the isolation structure 204 has edges intersecting with the top surface 202s of the substrate 202. The isolation structure 204, for example, is formed using isolation technology, such as local oxidation of silicon (LOCOS) or shallow trench isolation (STI), to define and electrically isolate the various active regions 4. In the present embodiment, the isolation structure 204 includes a STI. The isolation structure 204 may comprise silicon oxide, silicon nitride, silicon oxynitride, fluoride-doped silicate glass (FSG), a low-K dielectric material, other suitable materials, and/or combinations thereof. The isolation structure 204, and in the present embodiment, the STI, may be formed by any suitable process. As one example, the formation of the STI may include patterning the semiconductor substrate 202 by a photolithography process, etching a trench in the substrate 202 (for example, by using a dry etching, wet etching, and/or plasma etching process), and filling the trench (for example, by using a chemical vapor deposition process) with a dielectric material. In some embodiments, the filled trench may have a multi-layer structure such as a thermal oxide liner layer filled with silicon nitride or silicon oxide.

Still referring to FIG. 2, the gate stacks 220, 230, and 240 are formed in a dense region 202A of the substrate 202, and the gate stack 250 is formed in an isolation region 202B of the substrate 202. In some embodiments, spacing between two of the adjacent gate stacks 220, 230, and 240 in the dense region 202A is less than about 11 nm. In some embodiments, spacing between the gate stack 250 in the isolation region 202B and the adjacent gate stacks 240 in the dense region 202A is greater than about 11 nm. In some embodiments, the gate stacks 220, 230, 240, and 250 include, in order, a gate dielectric 206, a gate electrode 208, and a hard mask 210. In some embodiments, the gate stacks 220, 230, 240, and 250 are formed by sequentially depositing a gate dielectric layer, a gate electrode layer, and a hard mask layer on the substrate 202.

The gate dielectric layer, in one example, is a thin film comprising silicon oxide, silicon nitride, silicon oxynitride, high-k dielectrics, other suitable dielectric materials, or combinations thereof. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. In the present embodiment, the gate dielectric layer is a high-k dielectric layer with a thickness in the range of about 10 angstroms to about 30 angstroms. The gate dielectric layer may be formed using a suitable process such as atomic layer deposition (ALD), chemical vapor deposition (CVD), physical vapor deposition (PVD), thermal oxidation, UV-ozone oxidation, or combinations thereof. The gate dielectric layer may further comprise an interfacial layer (not shown) to reduce damage between the gate dielectric layer and the substrate 202. The interfacial layer may comprise silicon oxide.

In some embodiments, the gate electrode layer over the gate dielectric layer includes a single layer or multilayer structure. In the present embodiment, the gate electrode layer comprises polysilicon. Further, the gate electrode layer may be doped polysilicon with the same or different doping species. In one embodiment, the gate electrode layer has a thickness in the range of about 30 nm to about 60 nm. The gate electrode layer is formed, for example, using a process such as low-pressure chemical vapor deposition (LPCVD), plasma enhanced chemical vapor deposition (PECVD), other suitable processes, or combinations thereof.

Next, the hard mask layer is formed over the gate electrode layer. In some embodiments, the hard mask layer includes silicon oxide. In alternative embodiments, the hard mask layer includes silicon oxide, silicon nitride, silicon oxynitride, and/or other suitable dielectric materials, and may be formed using a method such as PECVD or LPCVD. The hard mask layer has a thickness in the range from about 100 angstroms to about 1200 angstroms. The patterned photo-sensitive layer is removed thereafter by a dry and/or wet stripping process.

Continuously, a patterning process is applied to the gate dielectric layer, the gate electrode layer, and the hard mask layer to form the gate dielectric 206, the gate electrode 208, and the hard mask 210, respectively, over the top surface 202s of the substrate 202. The patterning process includes, for example, forming a patterned photo-sensitive layer (not shown) over the hard mask layer by applying a photo-sensitive layer and then exposing the photo-sensitive layer to a radiation source. The pattern of the photo-sensitive layer is transferred to the hard mask layer, and then transferred to the gate electrode layer and the gate dielectric layer by a single etching process or multiple etching processes. The patterned photo-sensitive layer is removed thereafter by a dry and/or wet stripping process.

Figure 3:
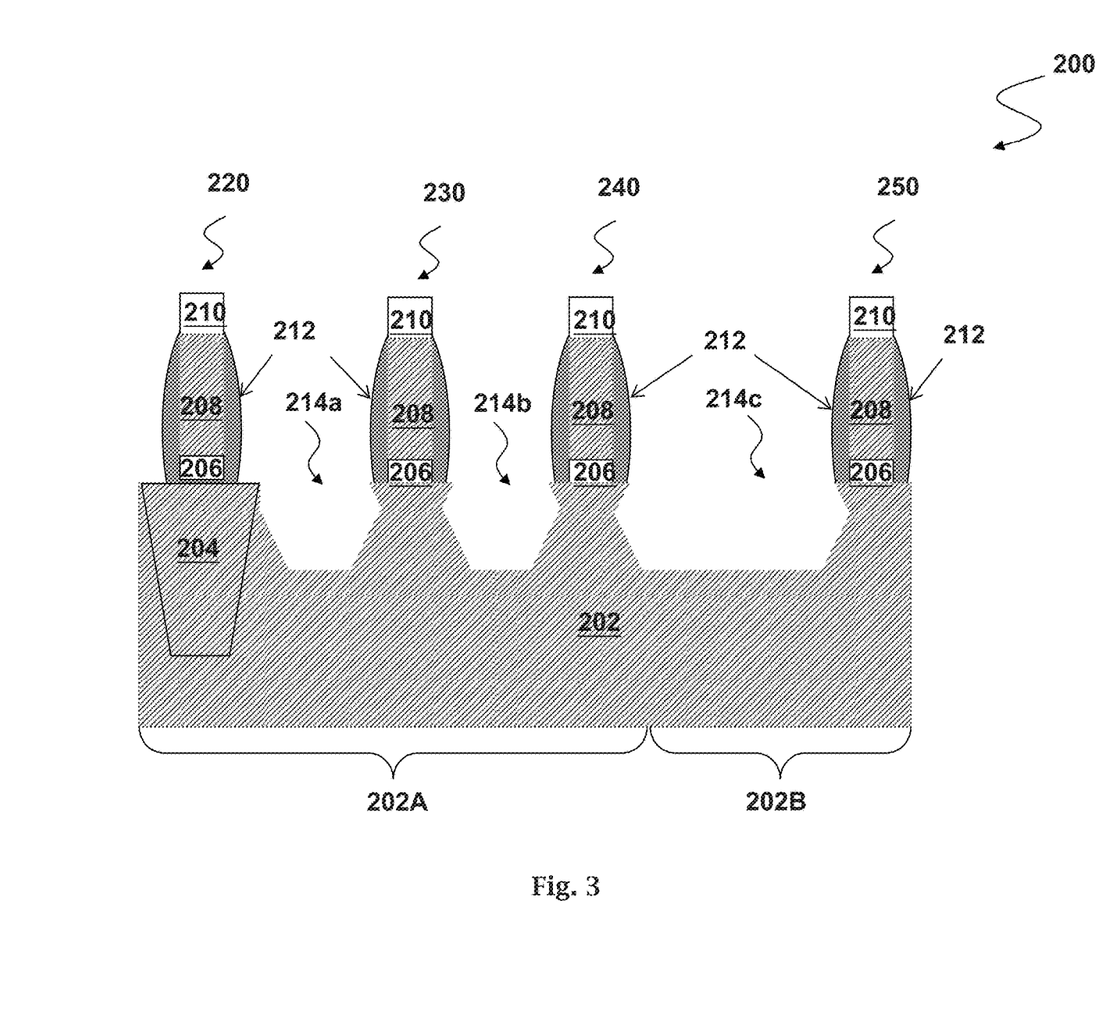

Referring to FIGS. 1 and 3, the method 100 proceeds to step 104 in which sidewall spacers 212 (or referred to gate spacers) are formed adjoining sidewalls of the gate stacks 220, 230, 240, and 250. In some embodiments, the sidewall spacers 212 are formed by depositing a spacer layer over the substrate 202 and the gate stacks 220, 230, 240, and 250. In some embodiments, the spacer layer is a conformal layer with a thickness ranging from about 70 angstroms to about 250 angstroms. In some embodiments, the spacer layer is a single-layer structure. In alternative embodiments, the spacer layer includes a multiple-layer structure. In some embodiments, the spacer layer formed of a material, including silicon nitride, SiCN, or combination thereof. In alternative embodiments, the spacer layer includes silicon oxide, silicon oxynitride, other suitable material, or combinations thereof. In the present embodiment, the spacer layer is formed by a deposition process including LPCVD, PECVD, MLD (molecular layer deposition), ALD, PEALD (plasma enhance ALD), or other suitable techniques.

In some embodiments, a removing process is then applied to remove a portion of the spacer layer to form the sidewall spacers 212. In some embodiments, the top portion and the bottom portion of the spacer layer are removed, while leaving the sidewall portion of the spacer layer to form the sidewall spacers 212 adjoining opposite sidewalls of the gate stacks 220, 230, 240, and 250. In some embodiments, the removing step includes an anisotropic etching process. In some embodiments, the removing step includes a dry etching process performed using F-containing and/or Cl-containing gas. In alternative embodiments, the removing step includes a wet etching process performed using wet etchant e.g., $H_3PO_4$.

The method 100 proceeds to step 106 in which recess cavities 214a, 214b, and 214c are formed in the substrate 202. The recess cavity 214a is formed between the gate stacks 220 and 230. In some embodiments, the recess cavity 214a is adjacent to edges of the gate stacks 220 and 230 with a portion below the sidewall spacers 212 adjoining sidewalls of the gate stacks 220 and 230. In some embodiments, the recess cavity 214a contacts the isolation structure 204. The recess cavity 214b is formed between the gate stacks 230 and 240. In some embodiments, the recess cavity 214b is adjacent to edges of the gate stacks 230 and 240 with a portion below the sidewall spacers 212 adjoining sidewalls of the gate stacks 230 and 240. The recess cavity 214c is formed between the gate stacks 240 and 250. In some embodiments, the recess cavity 214c is adjacent to edges of the gate stacks 240 and 250 with a portion below the sidewall spacers 212 adjoining sidewalls of the gate stacks 230 and 250. In some embodiments, the recess cavities 214a, 214b, and 214c are source and drain (S/D) recess cavities for the gate stacks 220, 230, 240, and 250.

In the present embodiment, the processes for forming the recess cavities 214a, 214b, and 214c are started using an anisotropic dry etching process to break through a native oxide formed on the top surface 202s of the substrate 202, followed by an isotropic or anisotropic (dry or wet) etching process. In some embodiments, the anisotropic dry etching process is performed using the sidewall spacers 212 as hard masks to recess the substrate 202. The surface 202s of the substrate 202 uncovered by the sidewall spacers 212 are recessed to form initial recess cavities in the substrate 202. In an embodiment, an anisotropic dry etching process may be performed under a pressure of about 1 mTorr to about 1000 mTorr, a power of about 50 W to about 1000 W, a bias voltage of about 20 V to about 500 V, at a temperature of about 20° C. to about 80° C., using HBr and/or $Cl_2$ and/or $CF_4$, $CH_2F_2$, $CHF_3$, $CH_3F$, $NF_3$, $SF_6$) as etch gases. Also, in the embodiments provided, the bias voltage used in the anisotropic dry etching process may be tuned to allow better control of an etching direction to achieve desired profiles for the S/D recess regions.

In some embodiments, a wet etching process is then provided to enlarge the initial recess cavities to form the recess cavities 214a, 214b, and 214c. In some embodiments, the wet etching process is performed using a chemical including hydration tetramethyl ammonium (TMAH), $NH_4OH$, APM ($NH_4+H_2O_2+H_2O$), or the like. In some embodiments, the recess cavities 214a, 214b, and 214c are wedge-shaped with tips extend into the substrate 202. In some embodiments, the recess cavities 214a, 214b, and 214c are wedge-shaped with tips in the region right underneath the sidewall spacers 212 toward the channel region under the gate stacks 220, 230, 240, and 250. In some embodiments, the recess cavities 214a, 214b, and 214c have width Wa, Wb, and Wc, respectively, measured between the opposite tips. In some embodiments, the width Wa in the dense region 202A is substantially the same as the width Wb in the dense region 202A. In some embodiments, the width Wa, Wb in the dense region 202A is less than the width Wc in the isolation region 202B.

Figure 4:
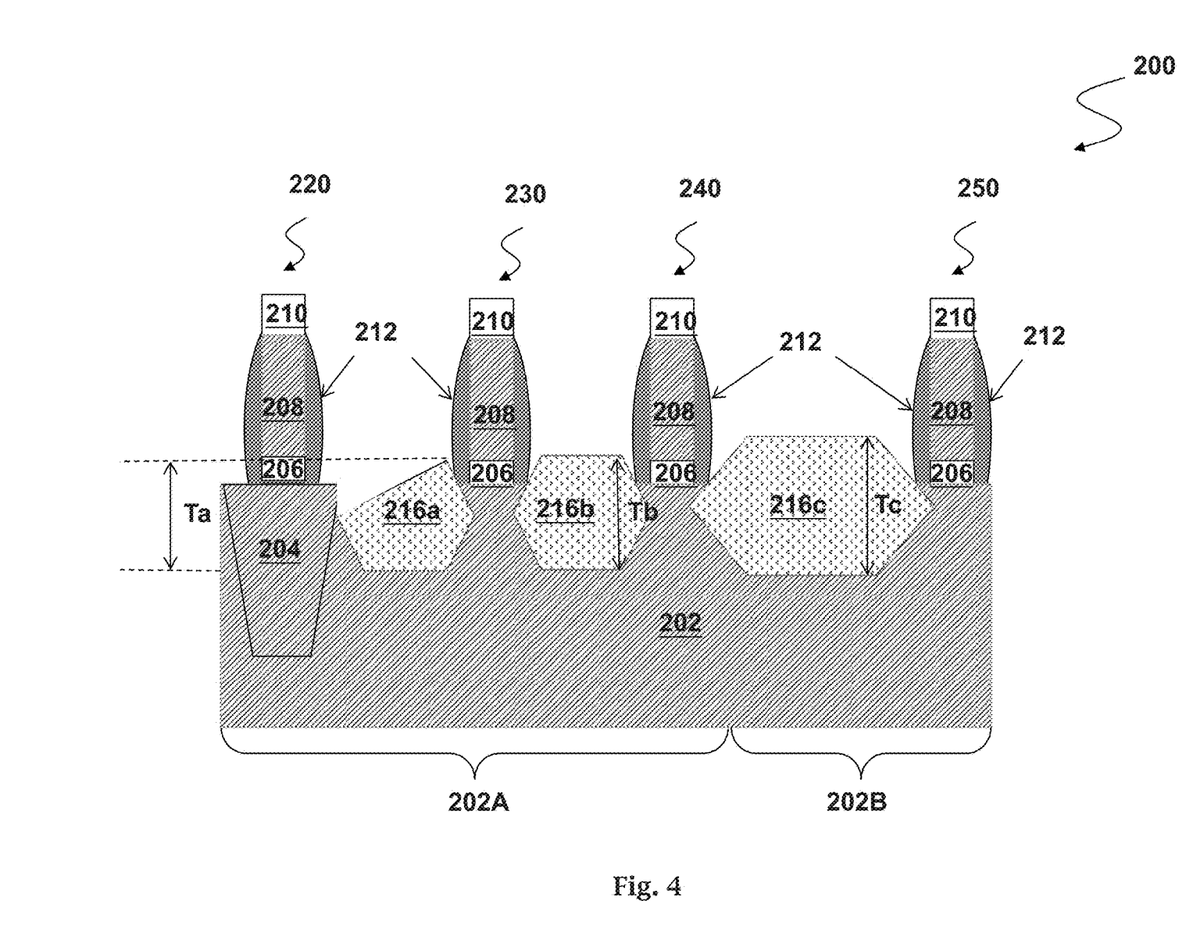

Referring to FIGS. 1 and 4, the method 100 continues with step 108 in which first source/drain features 216a, 216b, and 216c are formed in the recess cavities 214a, 214b, and 214c, respectively. In some embodiments, the first source/drain features 216a, 216b, and 216c include a strained material and are referred to strained features. In some embodiments, the strained material has a lattice constant different from the substrate 202 to induce a strain or stress on the channel region of the semiconductor device 200, and therefore enable carrier mobility of the device to enhance the device performance.

In some embodiments, a pre-cleaning process is performed to clean the recess cavities 214a, 214b, and 214c using a chemical comprising hydrofluoric acid (HF) or other suitable solution. Then, gaseous and/or liquid precursors may be provided to interact with the composition of the substrate 202 to form the strained material, such as silicon germanium (SiGe), to fill the recess cavities 214a, 214b, and 214c. In one embodiment, the process for forming the strained material comprising SiGe is performed at a temperature of about 600° to 750° C. and under a pressure of about 10 Torr to about 80 Torr, using reaction gases comprising $SiH_2Cl_2$, HCl, $GeH_4$, $B_2H_6$, $H_2$, or combinations thereof. In some embodiments, a ratio of a mass flow rate of the $SiH_2Cl_2$ to a mass flow rate of the HCl is in the range of about 0.45 to 0.55.

In some embodiments, the first source/drain features 216a, 216b, and 216c are grown in the recess cavities 214a, 214b, and 214c using a process including selective epitaxy growth (SEG), cyclic deposition and etching (CDE), chemical vapor deposition (CVD) techniques (e.g., vapor-phase epitaxy (VPE) and/or ultra-high vacuum CVD (UHV-CVD)), molecular beam epitaxy (MBE), other suitable epi processes, or combinations thereof.

The first source/drain features 216a, 216b, and 216c have a thickness Ta, Tb, and Tc, respectively. As mentioned above, the width We of the recess cavitiy 214c in the isolation region 202B is greater than the width Wa and Wb of the recess cavities 214a and 214b in the dense region 202A. Therefore, in the present embodiment, the thickness Tc of the first source/drain feature 216c in the isolation region 202B is greater than the thickness Ta and Tb of the first source/drain features 216a and 216b in the dense region 202A. In some embodiments, Ta is less than Tb and Tb is less than Tc. In the present embodiment, the thickness Ta, Tb, and Tc range between about 10 nm to about 80 nm.

In some embodiments, the growth of the strained material in the recess cavities 214b and 214c not adjacent to the isolation structure 204 is mainly parallel to the crystal plane of the top surface 202s of the substrate 202. In the present embodiment, the strained material in the recess cavities 214b and 214c not adjacent to the isolation structure 204 has an upper surface formed of the (100) crystal plane. In the present embodiment, the growth of the strained material in the recess cavity 214a adjacent to the isolation structure 204 is limited by the isolation structure 204 because the isolation structure 204 formed by silicon oxide fails to offer nucleation sites to grow an epitaxial material. In some embodiments, the growth of the strained material in the recess cavity 214 adjacent to the isolation structure 204 tends to have an upper surface not entirely parallel to the crystal plane of the top surface of the substrate 202. In some embodiments, the growth of the strained material in the recess cavity 214 adjacent to the isolation structure 204 tends to have an upper surface formed of (111) crystal plane with a stable surface energy.

Figure 5:
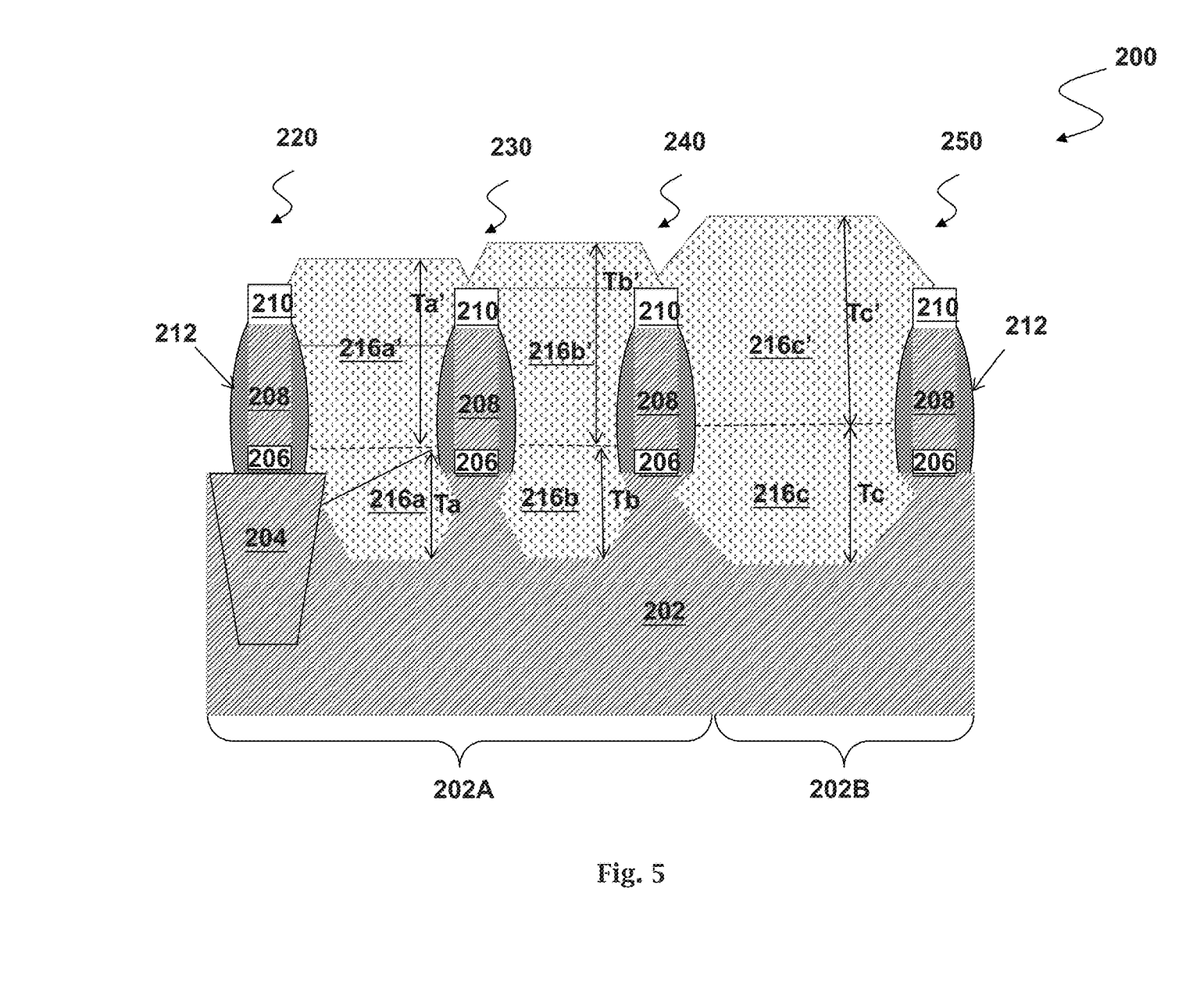

Referring to FIGS. 1 and 5, the method 100 continues with step 110 in which second source/drain features 216a', 216b', and 216c' are formed on the first source/drain features 216a, 216b, and 216c, respectively. In one embodiment, the second source/drain features 216a', 216b', and 216c' include a strained material same as the strained material for forming the first source/drain features 216a, 216b, and 216c. In alternative embodiments, the second source/drain features 216a', 216b', and 216c' include a strained material different from the strained material for forming the first source/drain features 216a, 216b, and 216c. In some embodiments, the second source/drain features 216a', 216b', and 216c' are grown using a process including selective epitaxy growth (SEG), cyclic deposition and etching (CDE), chemical vapor deposition (CVD) techniques (e.g., vapor-phase epitaxy (VPE) and/or ultra-high vacuum CVD (UHV-CVD)), molecular beam epitaxy (MBE), other suitable epi processes, or combinations thereof, same as the first source/drain features 216a, 216b, and 216c.

Gaseous and/or liquid precursors may be provided to interact with the composition of the first source/drain features 216a, 216b, and 216c to form the strained material of the second source/drain features 216a', 216b', and 216c', such as silicon germanium (SiGe). In one embodiment, the process for forming the strained material of the second source/drain features 216a', 216b', and 216c' is different from the process for forming the strained material of the first source/drain features 216a, 216b, and 216c. For example, a Ge concentration in the second source/drain features 216a', 216b', and 216c' may not need to be as large as a Ge concentration in the first source/drain features 216a, 216b, and 216c because most portions of the second source/drain features 216a', 216b', and 216c' will be removed in a subsequent process. In some embodiments, the growth rate of the strained material of the second source/drain features 216a', 216b', and 216c' is faster than the growth rate of the strained material of the first source/drain features 216a, 216b, and 216c by using different formation conditions. For example, a pressure used in a selective epitaxy growth (SEG) process for forming the strained material of the second source/drain features 216a', 216b', and 216c' is higher than a pressure used in a SEG process for forming the strained material of the first source/drain features 216a, 216b, and 216c. For example, a ratio of etch to deposition in a cyclic deposition and etching (CDE) process for forming the strained material of the second source/drain features 216a', 216b', and 216c' is less than a ratio of etch to deposition in a CDE process for forming the strained material of the first source/drain features 216a, 216b, and 216c. Therefore, a higher throughput can be achieved to save cost of production.

The second source/drain features 216a', 216b', and 216c' have thickness Ta', Tb', and Tc', respectively. In some embodiments, the thickness Ta', Tb', and Tc is thick enough, therefore, the second source/drain features 216a', 216b', and 216c' may merge together to cover the top surface of the gate stacks 220, 230, 240, and 250. In the present embodiment, the thickness Ta', Tb', and Tc' range between about 20 nm to about 200 nm. In the present embodiment, a ratio of the thickness Ta', Tb', and Tc' over the thickness Ta, Tb, and Tc, respectively, ranges between about 1 to about 9.

Figure 6:
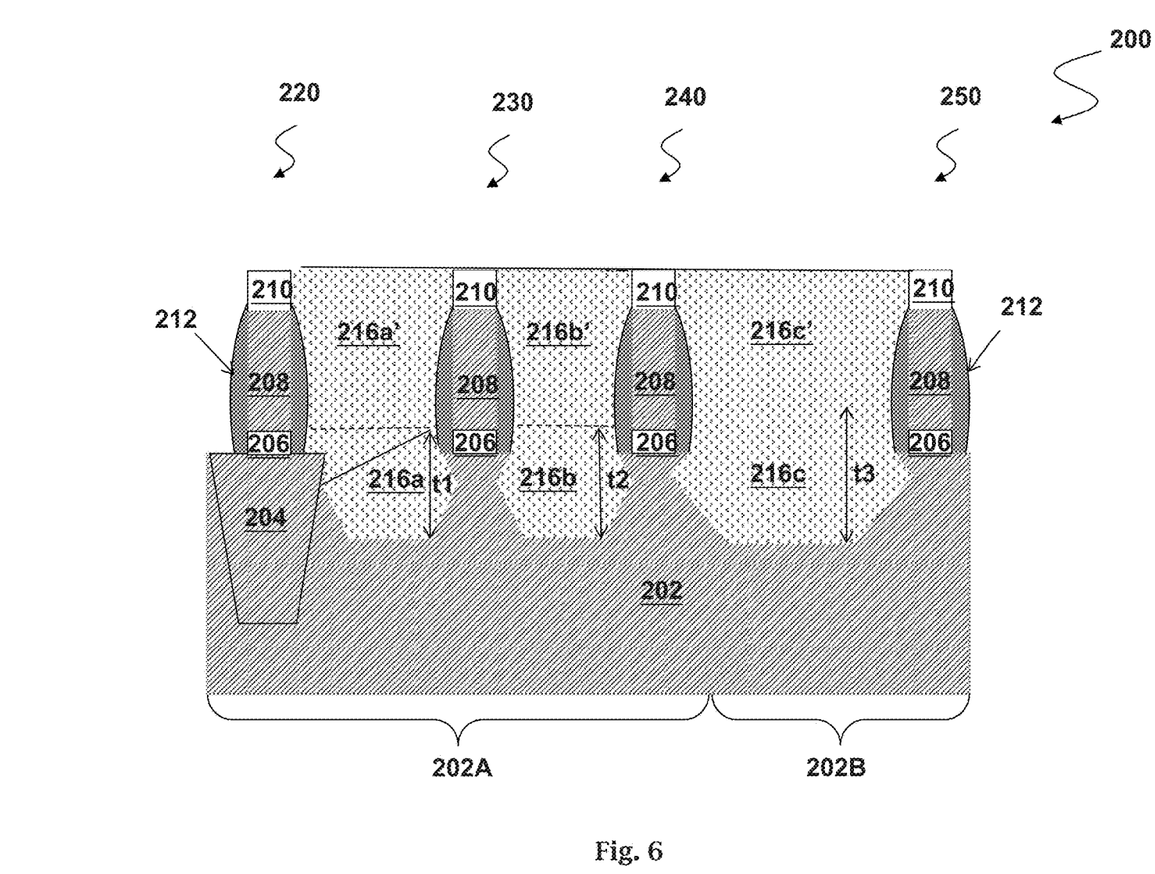

Referring to FIGS. 1 and 6, the method 100 continues with step 112 in which first portions of the second source/drain features 216a', 216b', and 216c' are removed. In some embodiments, the removing step removes the first portions of the second source/drain features 216a', 216b', and 216c' to expose top surface of the hard mask 210 of gate stacks 220, 230, 240, and 250. In some embodiments, the removing step is a chemical mechanical polishing (CMP) process. In some embodiments, the CMP process removes the first portions of the second source/drain features 216a', 216b', and 216c' over the gate stacks 220, 230, 240, and 250 to form a planarized second source/drain features 216a', 216b', and 216c'. In some embodiments, the CMP process is performed with a high selectivity among SiG and silicon oxide. For example, a removing ratio among SiG and silicon oxide is greater than 3 by using e.g., a slurry containing oxide, NaClO, and/or KOH.

Figure 7:
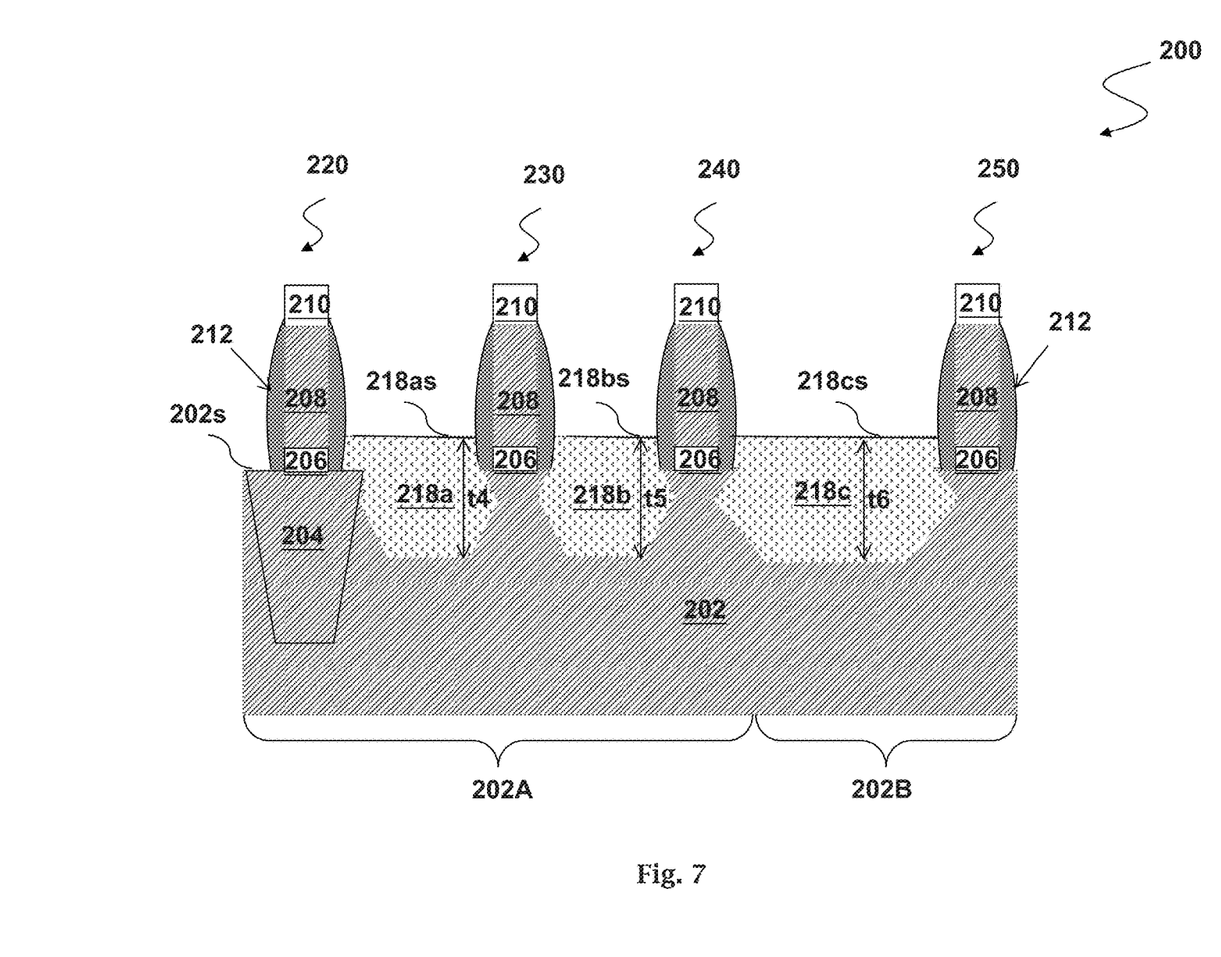

Referring to FIGS. 1 and 7, the method 100 continues with step 114 in which second portions of the second source/drain features 216a', 216b', and 216c' are removed. In some embodiments, the removing step removes the second portions of the second source/drain features 216a', 216b', and 216c' to expose portions of the exterior surface of the sidewall spacers 212 of gate stacks 220, 230, 240, and 250. In some embodiments, the removing step is an etching process. In some embodiments, the removing step is a wet etching process, using TMAH, NH$_4$OH, APM, or the like. In some embodiments, the removing step is a dry etching process, using Cl$_2$ and/or CF$_4$, CH$_2$F$_2$, CHF$_3$, CH$_3$F, NF$_3$, SF$_6$ as etch gases.

The removing step forms final source/drain (S/D) features 218a, 218b, and 218c between the gate stacks 220, 230, 240, and 250, respectively. In some embodiments, the final S/D features 218a, 218b, and 218c comprise the first source/drain features 216a, 216b, and 216c and the left portions of the second source/drain features 216a', 216b', and 216c', respectively. In alternative embodiments, the final S/D feature 218c is the first source/drain feature 216c. In some embodiments, a portion of the first source/drain feature 216c is removed to form the final S/D feature 218c. The final source/drain (S/D) features 218a, 218b, and 218c have thickness t4, t5, t6, respectively. In some embodiments, the thickness t4, t5, and t6 range from about 10 nm to about 120 nm. In some embodiments, the thickness t4, t5, and t6 are substantially the same. The final S/D features 218a, 218b, and 218c have upper surface 218as, 218bs, and 218cs, respectively. In some embodiments, the upper surface 218as, 218bs, and 218cs is substantially parallel to each other. In some embodiments, the upper surface 218as, 218bs, and 218cs is formed of the (100) crystal plane.

It is understood that the semiconductor device 200 may undergo further CMOS processes to form various features such as contacts/vias, interconnect metal layers, dielectric layers, passivation layers, etc. In some embodiment, the gate stacks may be dummy gate stacks. Thus, the CMOS processes further comprise a "gate last" process to replace the polysilicon gate electrode with a metal gate electrode to improve device performance. In one embodiment, the metal gate electrode may include a metal such as Al, Cu, W, Ti, Ta, TiN, TiAl, TiAlN, TaN, NiSi, CoSi, other suitable conductive materials, or combinations thereof. It has been observed that the modified strained structure provides a given amount of strain into channel region of a semiconductor device, thereby enhancing the device performance.

The various embodiments of the present disclosure discussed above offer advantages over conventional methods, it being understood that no particular advantage is required for all embodiments, and that different embodiments may offer different advantages. One of the advantages is the volume of the strained material adjacent to the isolation structure may be increased by providing an additional strained material over an original, therefore, the carrier mobility may be enhanced to upgrade the device performance. One of the advantages is the volume of the strained material adjacent to the isolation structure may be increased by providing an additional strained material over an original strained material, therefore, the carrier mobility may be enhanced to upgrade the device performance. One of the other advantages is the facet issue of the strained material adjacent to the isolation structure is improved and the loading effect of the strained material between the dense region and the isolation region is reduced. Therefore, the topography between the strained material adjacent to the isolation structure, in the dense region, and in the isolation region is improved.

In one embodiment, a method includes forming a gate stack over a surface of the substrate, forming a recess cavity in the substrate, forming a first epitaxial (epi) material in the recess cavity, forming a second epi material over the first epi material, and removing a portion of the second epi material.

In another embodiment, a method for fabricating a semiconductor device, includes providing a substrate having a dense region and a isolation region, forming a first gate stack in the dense region and a second gate stack in the isolation region, forming a first recess cavity in the substrate adjacent to the first gate stack and a second recess cavity in the substrate adjacent to the second gate stack, forming a first epi material in the first recess cavity and the second recess cavity having a first thickness and a second thickness, respectively, forming a second epi material over the first gate stack, the second gate stack, and the first epi material, remove first portions of the second epi material, and removing second portions of the second epi material to form a first source/drain feature for the first gate stack and a second source/drain feature for the second gate stack.

In still another embodiment, a semiconductor device, includes a substrate having a dense region and a isolation region, a first gate stack over the substrate in the dense region, a second gate stack over the substrate in the isolation region, a first source/drain feature in the substrate adjacent to the first gate stack having a first thickness, and a second source/drain feature in the substrate adjacent to the second gate stack having a second thickness. The second source/drain feature comprises a first strained layer and a second strained layer.

While the disclosure has described by way of example and in terms of the preferred embodiments, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A device comprising:
   a first gate stack disposed over a semiconductor substrate;
   a first source/drain feature disposed in the semiconductor substrate adjacent the first gate stack, wherein the first source/drain feature includes a first portion formed of a first semiconductor material and a second portion formed of a second semiconductor material that is different than the first semiconductor material, wherein the first semiconductor material of the first portion extends from a lowest edge of the first source/drain feature to a top surface of the first portion, the lowest edge of the first source/drain feature positioned deeper within the semiconductor substrate than any other portion of the first source/drain feature;
   a second source/drain feature disposed in the semiconductor substrate adjacent the first gate stack, wherein the second source/drain feature includes a third portion formed of the first semiconductor material, wherein the third portion has a top surface, a crystallographic orientation of the top surface of the first portion being different than the crystallographic orientation of a top surface of the third portion; and
   a shallow trench isolation structure disposed within the semiconductor substrate and having a top surface that extends along a plane that faces away from the semiconductor substrate, wherein the top surface of the first portion extends from a sidewall of the shallow trench isolation structure to an outer edge of a sidewall spacer disposed on the first gate stack such that the top surface of the first portion interfaces with the outer edge of the sidewall spacer above the plane that the top surface of the shallow trench isolation structure extends along, wherein the second portion extends over a portion of the shallow trench isolation structure and contacts the top surface and a side surface of the shallow trench isolation structure, such that a lowest bottom surface of the second portion is not parallel to a top surface of the second portion, wherein the top surface of the second portion extends along the same plane as the top surface of the third portion.

2. The device of claim 1, wherein the second portion of the first source/drain feature physically contacts the top surface of the first portion of the first source/drain feature.

3. The device of claim 1, wherein the first semiconductor material includes silicon germanium and the second semiconductor material includes silicon germanium.

4. The device of claim 3, wherein a concentration of germanium in the first semiconductor material is greater than a concentration of germanium in the second semiconductor material.

5. The device of claim 1, further comprising:
   a second gate stack disposed over the shallow trench isolation structure, the shallow trench isolation structure having a top surface facing away from the semiconductor substrate, and
   wherein the second portion of the first source/drain feature physically contacts the top surface of the shallow trench isolation structure.

6. The device of claim 5, wherein the second portion of the first source/drain feature extends continuously from the outer edge of the sidewall spacer to a sidewall spacer of the second gate stack.

7. The device of claim 1, wherein the top surface of the third portion is substantially parallel to a bottom surface of the third portion.

8. A device comprising:
   a first gate stack disposed over a substrate;
   a first source/drain feature disposed in the substrate adjacent the first gate stack, wherein the first source/drain feature includes a first portion formed of a first semiconductor material and a second portion disposed over the first portion and formed of a second semiconductor material that is different than the first semiconductor material, wherein the first portion has a top surface having a first crystallographic orientation and has a first thickness measured from a bottom surface of the first portion to the top surface of the first portion, wherein the first semiconductor material of the first portion extends from a lowest edge of the first source/drain feature to the top surface of the first portion, the lowest edge of the first source/drain feature positioned deeper within the substrate than any other portion of the first source/drain feature;
   a second gate stack disposed over the substrate;
   a second source/drain feature disposed in the substrate adjacent the second gate stack, wherein the second source/drain feature includes a third portion formed of the first semiconductor material, wherein the third portion has a top surface having a second crystallographic orientation and has a second thickness measured from a bottom surface of the third portion to the top surface of the third portion, the second crystallographic orientation being different from than first crystallographic orientation, the second thickness being different than the first thickness; and
   a shallow trench isolation structure disposed within the substrate and having a top surface that extends along a plane that faces away from the substrate, wherein the top surface of the first portion extends from a sidewall of the shallow trench isolation structure to an outer edge of a sidewall spacer disposed on the first gate stack such that the top surface of the first portion interfaces with the outer edge of the sidewall spacer above the plane that the top surface of the shallow trench isolation structure extends along, wherein the second portion extends over a portion of the shallow trench isolation structure and contacts the top surface and a side surface of the shallow trench isolation structure, such that a lowest bottom surface of the second portion is not parallel to a top surface of the second portion, wherein the top surface of the second portion extends along the same plane as the top surface of the third portion.

9. The device of claim 8, wherein the second thickness is greater than the first thickness.

10. The device of claim 8, further comprising:
a third source/drain feature disposed in the substrate adjacent the first and second gate stacks, wherein the third source/drain feature includes a fourth portion formed of the first semiconductor material and a fifth portion disposed over the fourth portion and formed of the second semiconductor material, wherein the fourth portion has a top surface having a (100) crystallographic orientation and has a third thickness measured from a bottom surface of the fourth portion to the top surface of the fourth portion, the third thickness being equal to the first thickness.

11. The device of claim 8, wherein the first crystallographic orientation is a (111) crystallographic orientation, and the second crystallographic orientation is a (100) crystallographic orientation.

12. The device of claim 8, wherein a concentration of germanium in the first semiconductor material is greater than a concentration of germanium in the second semiconductor material.

13. The device of claim 8, wherein the bottom surface of the first portion of the first source/drain feature is substantially coplanar with the bottom surface of the third portion of the second source/drain feature.

14. The device of claim 8, wherein the first portion of the source/drain feature extends within the substrate under the sidewall spacer disposed on the first gate stack.

15. The device of claim 8, wherein the second portion of the first source/drain feature physically contacts the first portion of the first source/drain feature.

16. A semiconductor device, comprising:
a first gate stack over a substrate;
a second gate stack over the substrate;
a first source/drain feature in the substrate adjacent to the first gate stack having a first thickness, wherein the first source/drain feature comprises a first strained feature disposed over a second strained feature;
a second source/drain feature in the substrate adjacent to the second gate stack having a second thickness, wherein the second source/drain feature comprises a third strained feature; and
a shallow trench isolation structure disposed within the substrate and having a top surface that extends along a plane that faces away from the substrate, wherein a top surface of the second strained feature extends from a sidewall of the shallow trench isolation structure to an outer edge of a sidewall spacer disposed on the second gate stack such that the top surface of the second strained feature interfaces with the outer edge of the sidewall spacer disposed on the second gate stack above the plane that the top surface of the shallow trench isolation structure extends along, wherein a top surface of the first strained feature has a same crystallographic orientation from an outer edge of a sidewall spacer disposed on the first gate stack to the outer edge of the sidewall spacer disposed on the second gate stack, wherein a portion of the top surface of the first strained feature lies above the plane that a top surface of the substrate extends along, wherein the top surface of the first strained feature extends along the same plane as a top surface of the third strained feature.

17. The device of claim 16, further comprising:
a third source/drain feature in the substrate, wherein the third source/drain feature has a top surface substantially parallel to the top surface of the first source/drain feature or the second source/drain feature.

18. The device of claim 17, wherein the third source/drain feature has a third thickness substantially the same as the first thickness or the second thickness.

19. The device of claim 17, wherein the third source/drain feature comprises a material substantially the same as a material of the second source/drain feature.

20. The device of claim 16, wherein the first strained feature and the second strained feature comprise SiGe material with different Ge concentrations.

\* \* \* \* \*